(12) United States Patent
Ivanov

(10) Patent No.: US 6,840,427 B2
(45) Date of Patent: Jan. 11, 2005

(54) METHOD OF MANUFACTURING SPUTTER TARGETS WITH INTERNAL COOLING CHANNELS

(75) Inventor: Eugene Y. Ivanov, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 94 days.

(21) Appl. No.: 10/344,782

(22) PCT Filed: Sep. 11, 2001

(86) PCT No.: PCT/US01/28411

§ 371 (c)(1),
(2), (4) Date: Feb. 13, 2003

(87) PCT Pub. No.: WO02/22300

PCT Pub. Date: Mar. 21, 2002

(65) Prior Publication Data

US 2004/0056070 A1 Mar. 25, 2004

Related U.S. Application Data

(60) Provisional application No. 60/231,917, filed on Sep. 11, 2000.

(51) Int. Cl.[7] ........................... B23K 20/12; B23K 31/02
(52) U.S. Cl. ..................... 228/115; 228/164; 228/173.1
(58) Field of Search ................................. 228/115, 116, 228/117, 141.1, 165, 170, 171, 173.1, 174, 173.3; 204/298.12, 298.13

(56) References Cited

U.S. PATENT DOCUMENTS

| | | |
|---|---|---|
| 3,649,512 A | 3/1972 | Ackley |
| 3,838,031 A | 9/1974 | Snaper |
| 3,849,869 A | 11/1974 | Boccalari |
| 4,135,286 A | 1/1979 | Wright et al. |
| 4,421,628 A | 12/1983 | Quaderer |
| 4,676,843 A | 6/1987 | Nazmy |
| 4,826,584 A | 5/1989 | dos Santos Pereiro Ribeiro |
| 4,964,564 A | 10/1990 | Neal et al. |
| 5,035,314 A | 7/1991 | Kornylak |
| 5,039,913 A | 8/1991 | Wegmann et al. |
| 5,215,639 A | 6/1993 | Boys |
| 5,230,459 A * | 7/1993 | Mueller et al. ............. 228/164 |
| 5,253,796 A | 10/1993 | Stacher et al. |
| 5,269,894 A | 12/1993 | Kerschbaumer |
| 5,269,899 A | 12/1993 | Fan |
| 5,328,585 A | 7/1994 | Stevenson et al. |
| 5,433,835 A | 7/1995 | Demaray et al. |
| 5,487,822 A | 1/1996 | Demaray et al. |
| 5,565,071 A | 10/1996 | Demaray et al. |
| 5,595,337 A | 1/1997 | Demaray et al. |
| 5,603,816 A * | 2/1997 | Demaray et al. ...... 204/298.07 |
| 5,857,611 A | 1/1999 | Gilman et al. |
| 6,071,389 A | 6/2000 | Zhang |
| 6,749,103 B1 * | 6/2004 | Ivanov et al. ................ 228/115 |

* cited by examiner

Primary Examiner—Stanley S. Silverman
Assistant Examiner—Colleen P. Cooke
(74) Attorney, Agent, or Firm—Wegman Hessler & Vanderburg

(57) ABSTRACT

The present invention pertains to low temperature pressure consolidation methods which provide for bonding of target material (10) to the backing plate material (15) capable of withstanding the stresses imposed by high sputtering rates. The sputter target assemblies (5) in accordance with the present invention are preferably comprised of target materials (10) and backing plate materials (15) having dissimilar thermal expansion coefficients and incorporate internal cooling channels (20). In the preferred embodiment, the resulting bond and the formation of the cooling channels (20) are cooperative.

20 Claims, 9 Drawing Sheets

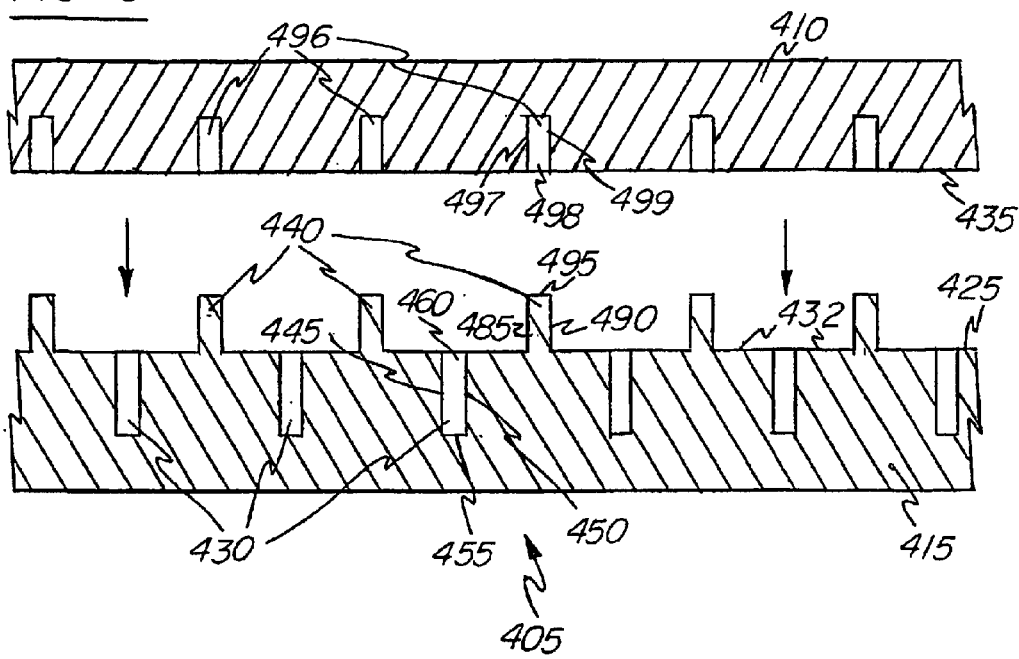
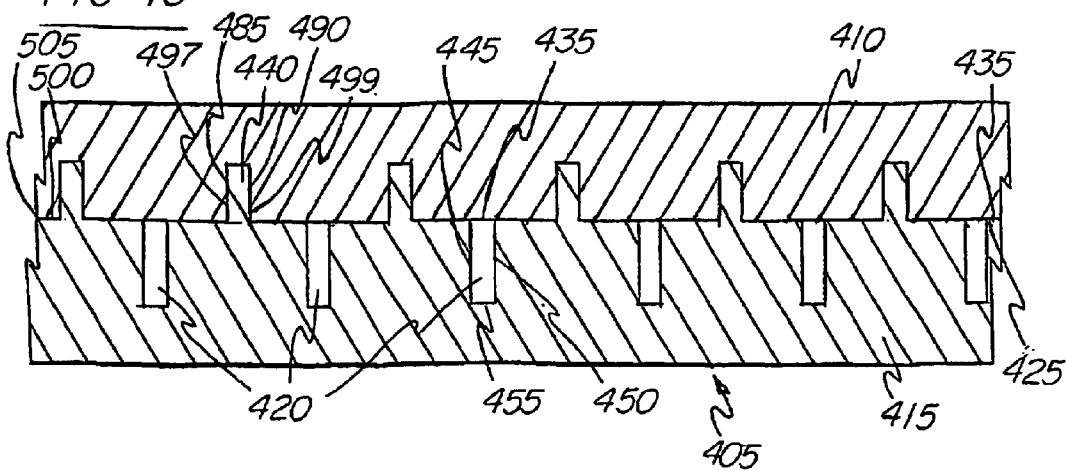

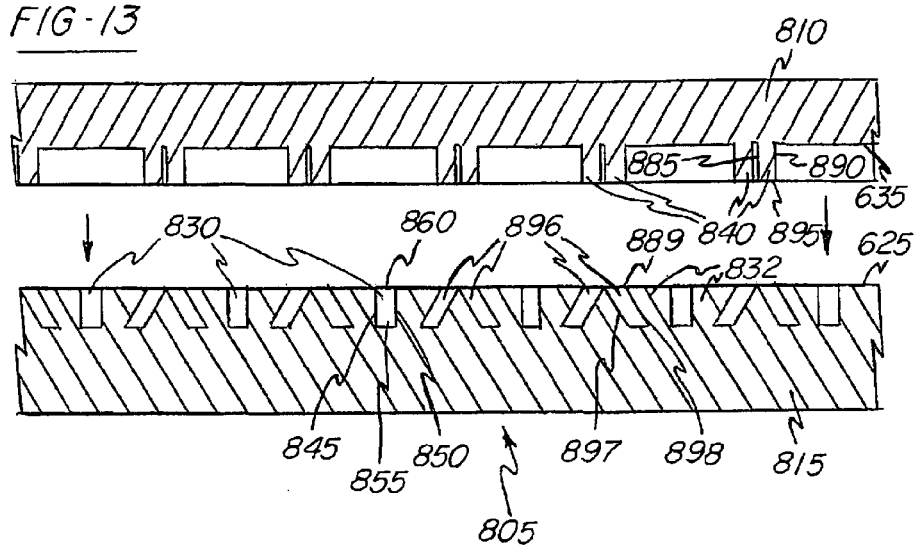
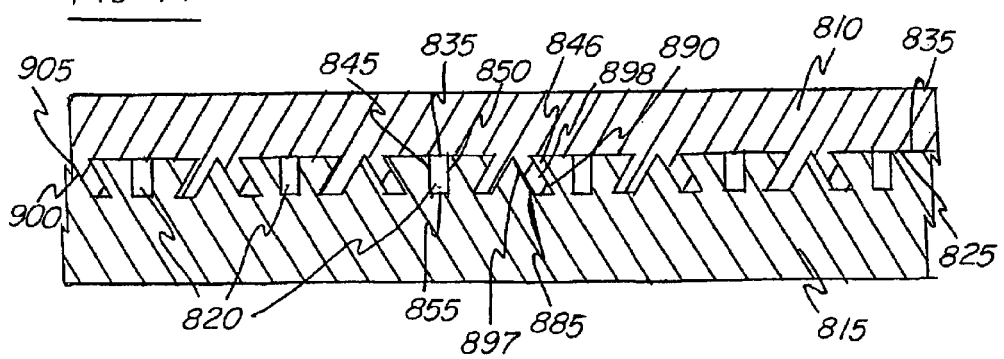

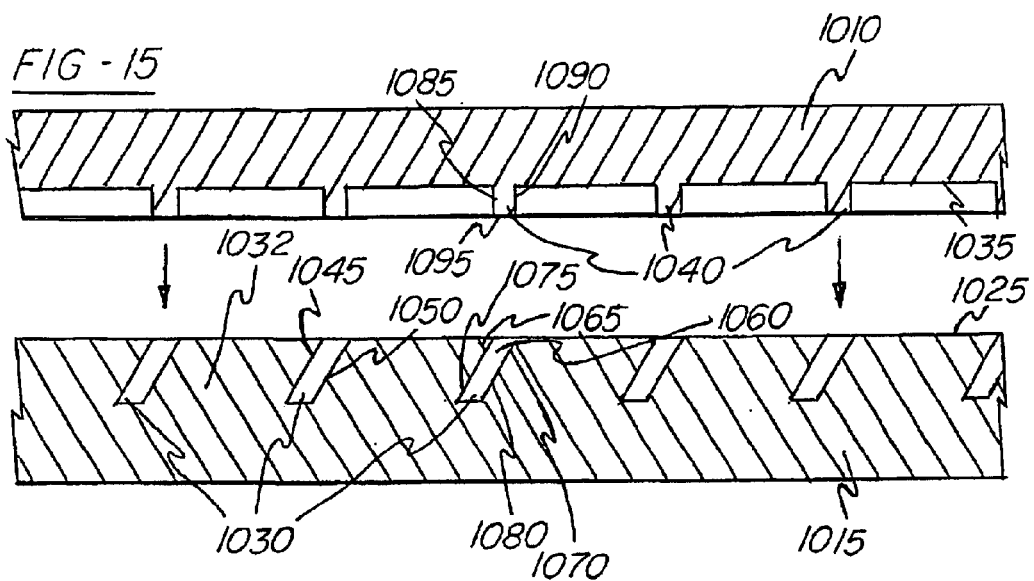
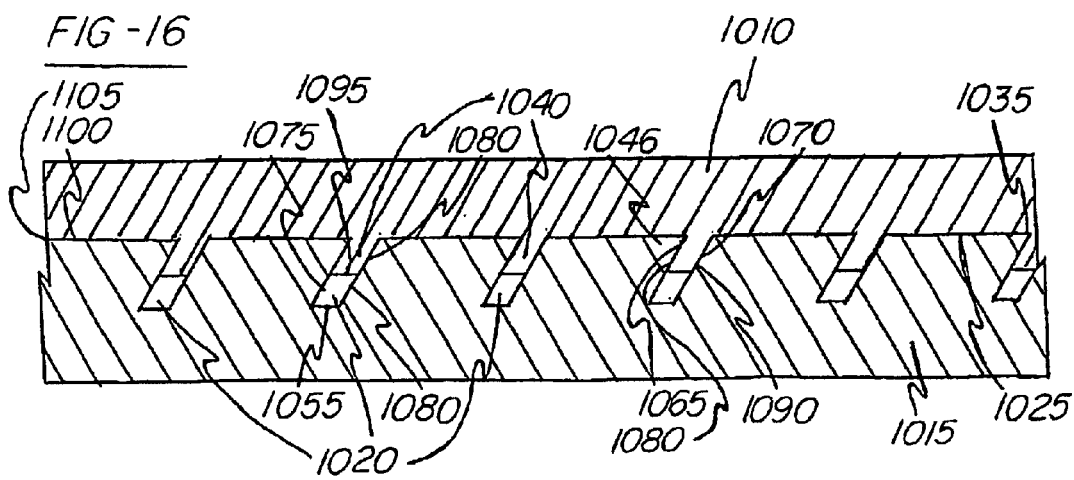

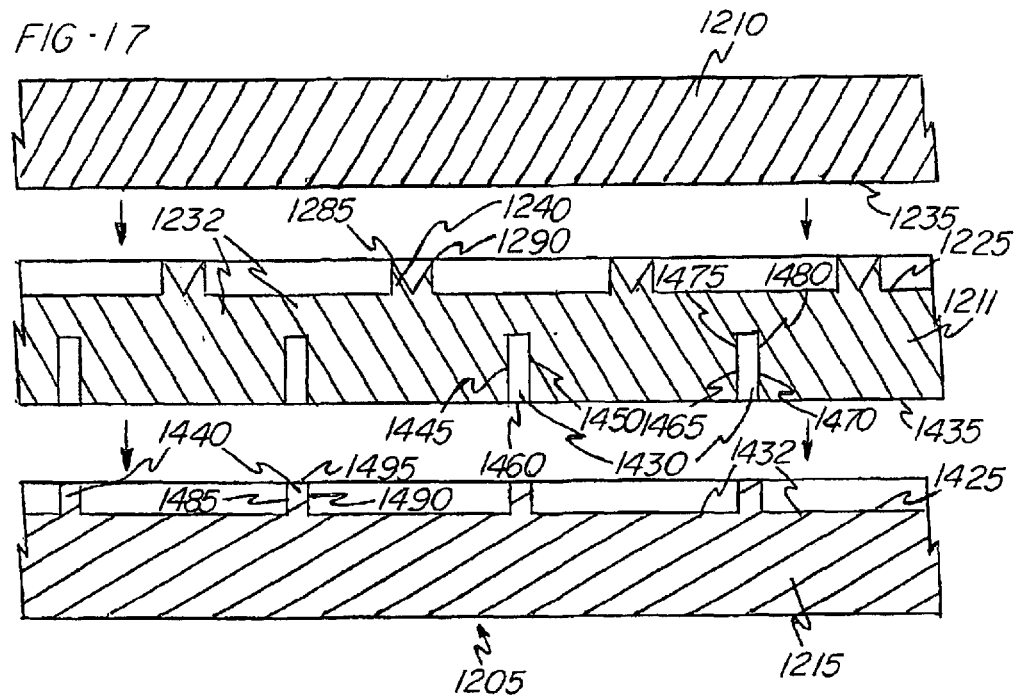
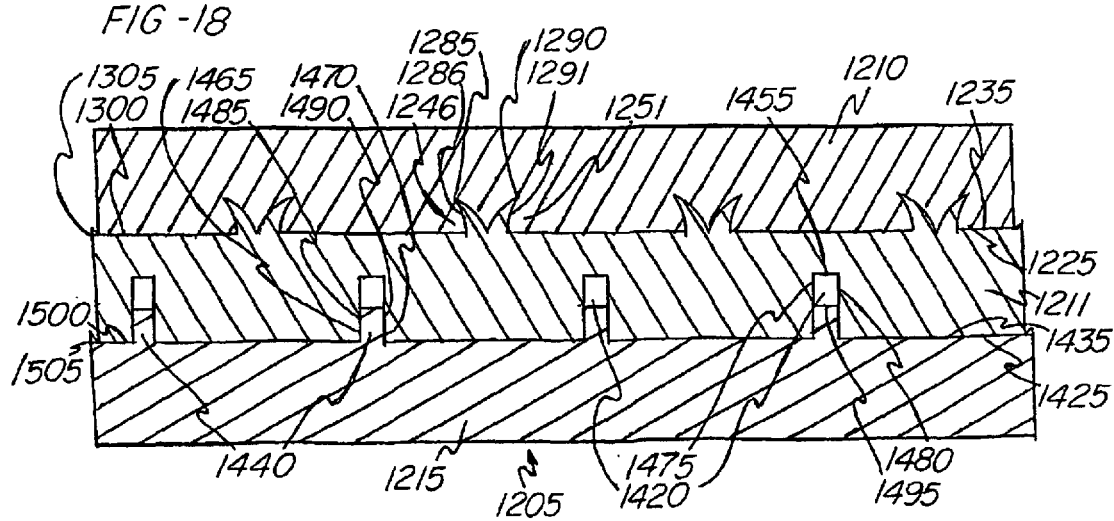

METHOD OF MANUFACTURING SPUTTER TARGETS WITH INTERNAL COOLING CHANNELS

CROSS-REFERENCE TO RELATED APPLICATIONS

Priority filing benefit of (1) International PCT application PCT/US01/28411 filed Sep. 11, 2001, and published under PCT 21(2) in the English language; (2) U.S. Provisional Application Ser. No. 60/231,917 filed Sep. 11, 2000.

FIELD OF THE INVENTION

The present invention relates to sputter target assemblies for use within sputtering systems. More specifically, the present invention pertains to sputter target assemblies with internal cooling channels which include a target material bonded, by low temperature pressure consolidation, to a backing plate material.

BACKGROUND OF THE INVENTION

Cathodic sputtering is widely used for the deposition of thin films, or layers, of material onto desired substrates. The sputtering process employs gas ion bombardment of a target material having a face formed of a material that is to be deposited as a thin film, or layer, on the given substrate. Ion bombardment of the target material not only causes atoms or molecules of the target material to be sputtered, it imparts considerable thermal energy to the sputter target assembly. This heat is typically dissipated by use of a cooling fluid circulated beneath, through or around a thermally conductive backing plate material that is positioned in heat exchange relation with the target material.

The target material and backing plate material form a part of a cathode assembly which, together with an anode, is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target material surface, dislodge the target material. The dislodged target material traverses the evacuated enclosure and deposits, as a thin film, or layer, on the given substrate. The substrate is normally located proximate the anode within the evacuated chamber.

In addition to the use of an electrical field, increased sputtering rates have been achieved by concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target material surface thereby increasing the number of electron-gas atom collisions in the annular region to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway. Magnetron sputtering imposes considerable thermal energy upon the sputter target assembly, especially within the concentrated annular region of the target raceway.

In typical sputter target assemblies, the target material is attached to a nonmagnetic backing plate material. The backing plate material is normally water-cooled to carry away the heat generated by the ion bombardment of the target material. In order to achieve good thermal and electrical contact between the target material and backing plate material, these members are commonly bonded to one another by means of soldering, brazing, diffusion bonding, clamping and by epoxy cement and the like. These bonding methods typically involve imposition of high temperatures. Sputter target assemblies bonded by these methods can bow or bend at high sputtering rates, especially when a large difference exists between the coefficients of thermal expansion for the target material and backing plate material. In sputter target assemblies with internal cooling channels, bowing and bending induces leakage; the typical bonding methods, described above, tend to deform, or otherwise partially constrict, the cooling channels. Additionally, known bonding techniques, as discussed above, result in undesirable grain growth in the target material or the resulting bond cannot withstand the stresses imposed by high sputtering rates.

Therefore, there remains a need in the art of sputter target assemblies for a method of bonding the target material to the backing plate material which will withstand the stresses imposed by high sputtering rates, will allow for use of materials with dissimilar thermal expansion characteristics, and will not induce grain growth or cooling channel deformation.

SUMMARY OF THE INVENTION

The primary objective of the present invention is to provide low temperature pressure consolidation methods, capable of withstanding the stresses imposed by high sputtering rates, for bonding target material to backing plate material. The preferred sputter target assemblies in accordance with the present invention are comprised of target materials and backing plate materials and incorporate internal cooling channels.

The bonding methods of the present invention allow target and backing plate assembly bonding with the assembly exhibiting reduced bowing or bending. Additionally, the low temperature pressure consolidation methods of the present invention do not cause undesirable grain growth of the target material or deformation of the cooling channels during consolidation of the target material with the backing plate material.

As a result, the sputter target assemblies in accordance with the present invention are able to utilize backing plate materials having higher thermal and lower electrical conductivity than the conventional backing plate materials normally compatible with a specific target material. The reduction of bowing and bending is especially beneficial in sputter target assemblies with internal cooling channels. The opportunity for leakage is greatly reduced by use of the low temperature pressure consolidation methods in accordance with the present invention.

A second objective of the present invention provides for formation of the cooling channels is such a way that the cooling channel formation also results in an interference friction fit bond between the target material and the backing plate material. Thereby, the time and steps necessary for sputter target assembly production are greatly reduced.

Other advantages and benefits of the present invention will become apparent with further reference to the appended drawings, the following detailed description and the appended claims.

BRIEF DESCRIPTION OF THE DRAWINGS

FIG. 9 depicts a profile view of a third embodiment of the sputter target assembly in accordance with the present invention prior to consolidation of the target material and backing plate material;

FIG. 10 depicts a profile view of the third embodiment of the sputter target assembly of FIG. 9 subsequent to consolidation of the target material and backing plate material;

FIG. 13 depicts a profile view of a fifth embodiment of the sputter target assembly in accordance with the present invention prior to consolidation of the target material and backing plate material;

FIG. 14 depicts a profile view of the fifth embodiment of the sputter target assembly of FIG. 13 subsequent to consolidation of the target material and backing plate material;

FIG. 15 depicts a profile view of a sixth embodiment of the sputter target assembly in accordance with the present invention prior to consolidation of the target material and backing plate material;

FIG. 16 depicts a profile view of the sixth embodiment of the sputter target assembly of FIG. 15 subsequent to consolidation of the target material and backing plate material;

FIG. 17 depicts a profile view of a seventh embodiment of the sputter target assembly in accordance with the present invention prior to consolidation of the target material, interposing material and backing plate material; and FIG. 18 depicts a profile view of the seventh embodiment of the sputter target assembly of FIG. 17 subsequent to consolidation of the target material, interposing material and backing plate material.

DETAIL DESCRIPTION OF THE INVENTION

Figure 1:
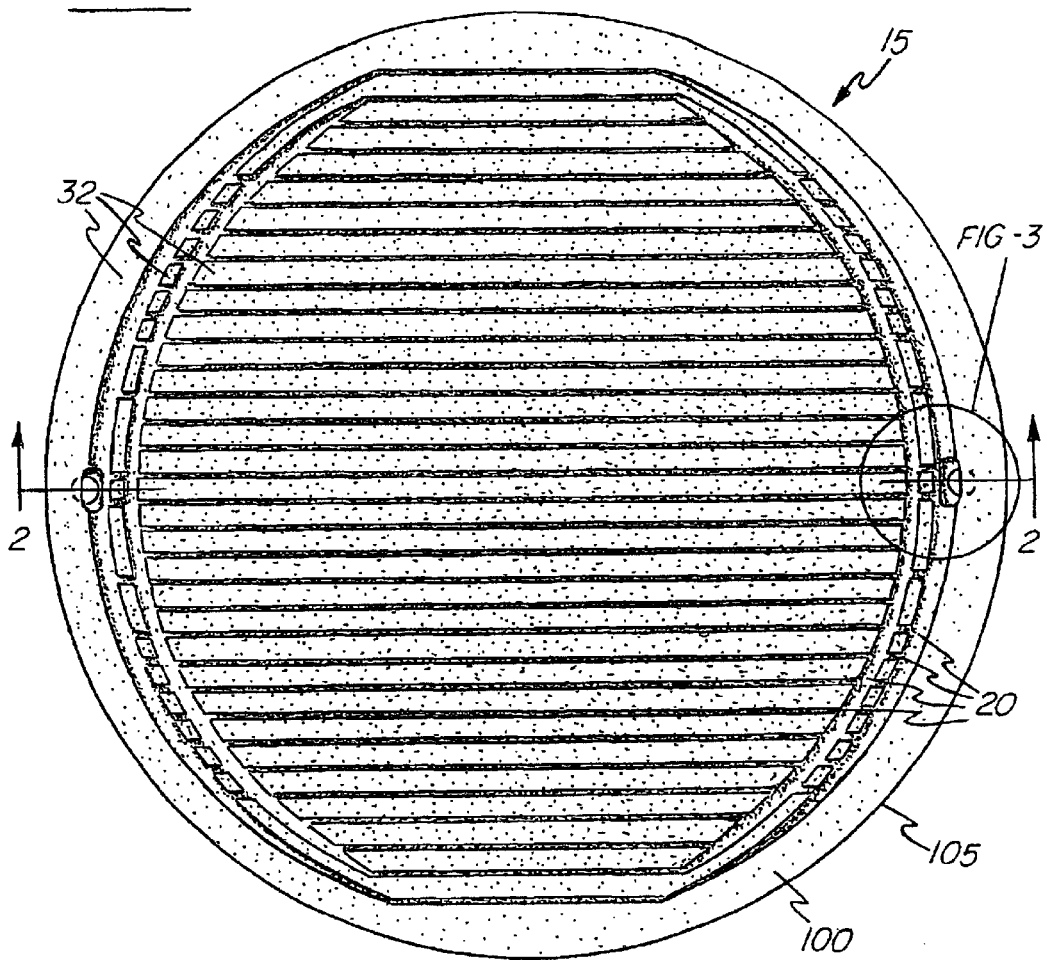
FIG. 1 depicts a plan view of the preferred embodiment of the backing plate material, with grooves formed therein, for use in accordance with the present invention.
Figure 2:
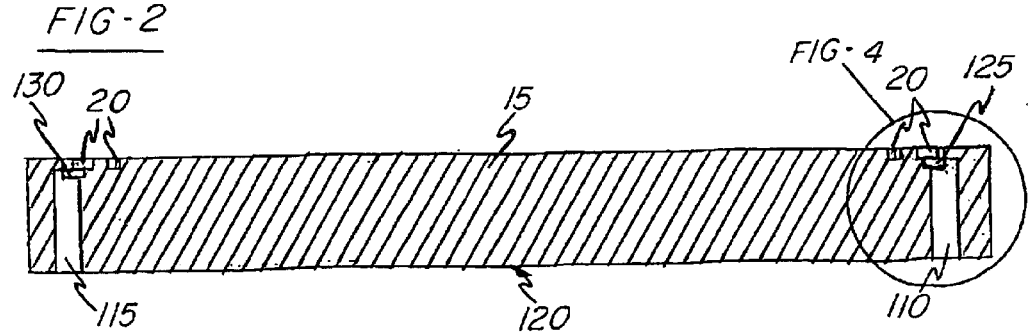
FIG. 2 depicts a profile view of a section of the preferred backing plate material, taken along line 2—2 of FIG. 1, with grooves, coolant inlet and coolant outlet.
Figure 3:
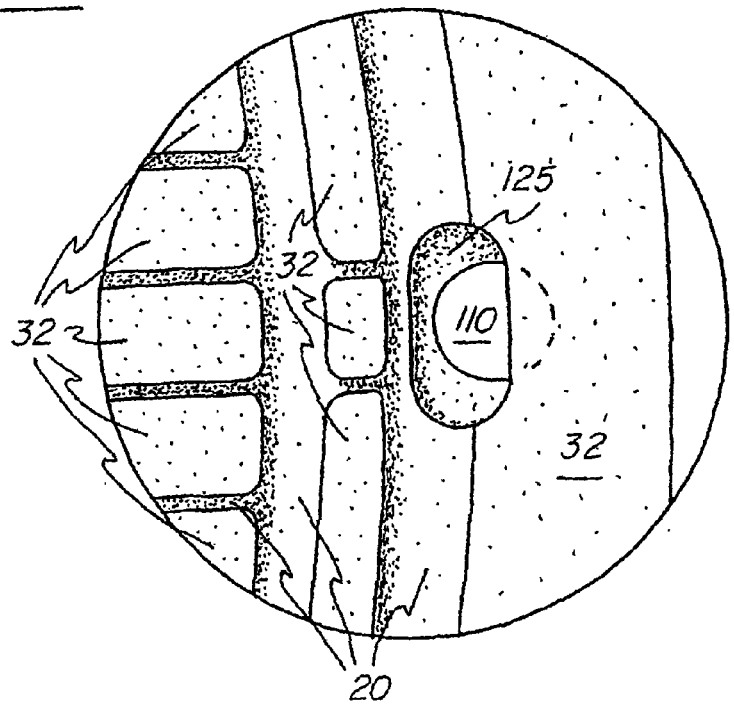
FIG. 3 depicts a plan view of a section of the preferred backing plate material, taken along line 3 of FIG. 1, with coolant inlet and related passageway.
Figure 4:
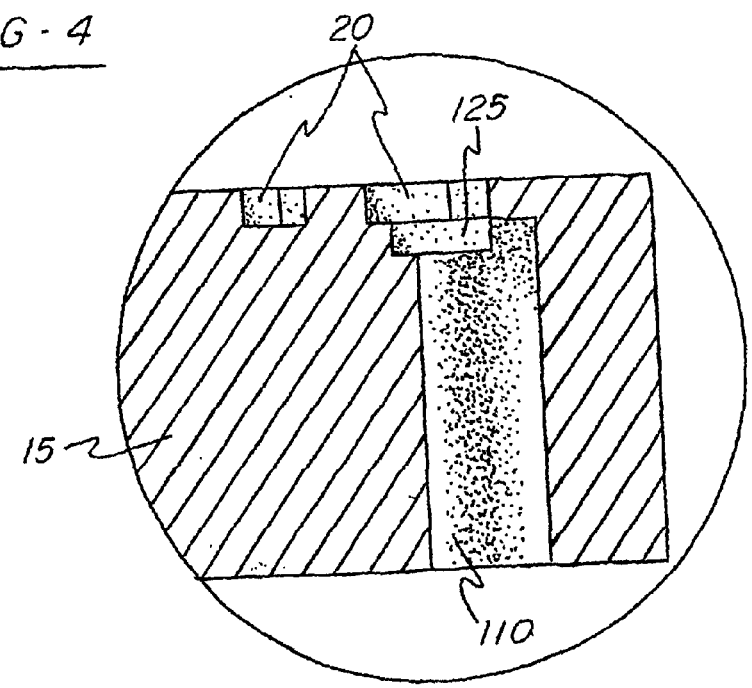
FIG. 4 depicts a profile view of a section of the preferred backing plate material, taken along line 4 of FIG. 2, with coolant inlet and related passageway.

Referring initially to FIGS. 1–6, there is shown a preferred embodiment of a sputter target assembly 5 in accordance with the present invention. As best seen with reference to FIG. 6, the preferred sputter target assembly 5 comprises a target material 10 bonded to a backing plate material 15 such that cooling channels 20 are integrally formed therewithin. Initially, both the target material 10 and the backing plate material 15 are formed into individual discs. In this preferred embodiment, grooves 30 (FIG. 5) are formed in the substantially circular mating surface 25 of the backing plate material 15. The grooves 30 define a plurality of islands 32 where the mating surface 25 remains. Protruding portions 40, defining a mirror image of the grooves 30 of mating surface 25, are formed in the substantially circular mating surface 35 of the target material 10. As discussed in detail below, the grooves 30 and the protruding portions 40 cooperate to result in a friction fit bond between the target material 10 and the backing plate material 15, as well as, forming the cooling channels 20.

Figure 5:
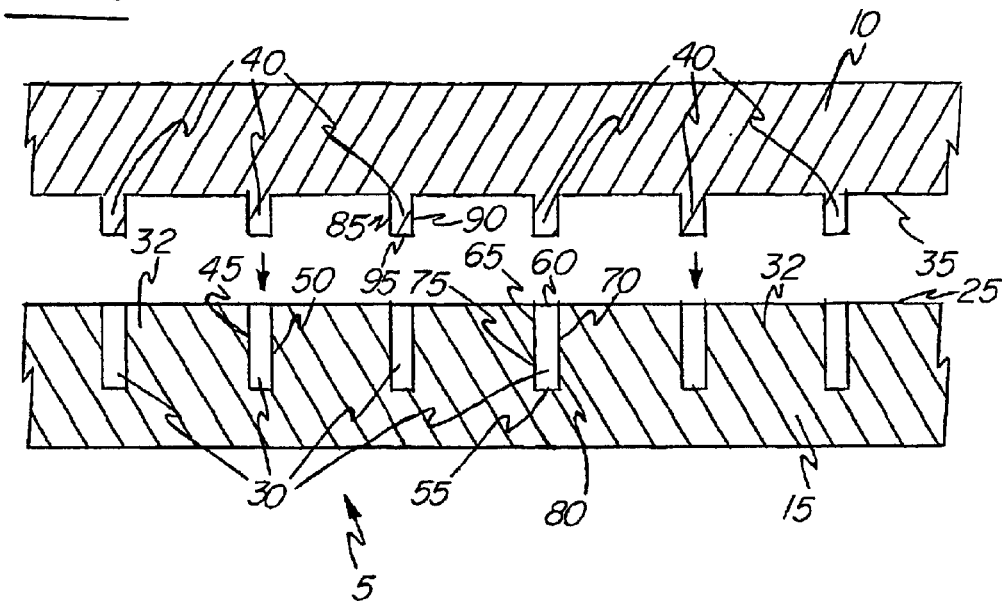
FIG. 5 depicts a profile view of the preferred sputter target assembly in accordance with the present invention prior to consolidation of the target material and backing plate material.
Figure 6:
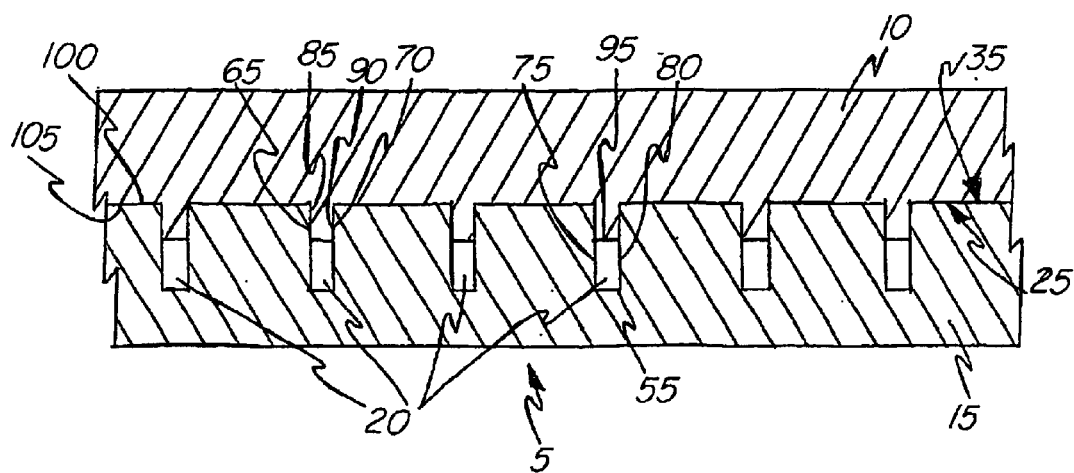
FIG. 6 depicts a profile view of the preferred sputter target assembly of FIG. 5 subsequent to consolidation of the target material and backing plate material.

With specific reference to FIG. 5, the grooves 30 are shown to include opposing sidewalls 45, 50, a bottom portion 55 and an opening 60. Each sidewall 45,50 comprises an upper portion 65, 70, respectively, and a lower portion 75, 80, respectively. The protruding portions 40 include opposing sides 85, 90 and an end portion 95. Referring to FIG. 6, the protruding portions 40 are shown as having been received within the grooves 30 through openings 60. The upper portions 65, 70 of the grooves 30 cooperate with the sides 85, 90 of the protruding portions 40 to form a friction fit bond between the target material 10 and the backing plate material 15. Most preferably, the distance between the sides 85, 90 of the protruding portions 40, the "protruding portion thickness," is greater than the distance between the sidewalls 45, 50 of the corresponding grooves 30, the "groove width." When the protruding portion thickness is greater than the groove width an "interference friction fit bond" results between the target material 10 and the backing plate material 15 when the protruding portions 40 are received within the grooves 30.

Subsequent to forming the grooves 30 and protruding portions 40, the mating surface 25 is positioned proximate mating surface 35, with protruding portions 40 aligned with corresponding grooves 30, the sputter target assembly 5 is then bonded along an annular zone 100 adjacent the peripheral boundary 105. This initial bonding along the annular zone 100 of the assembly 5 may be achieved by conventional means such as by E-beam welding under vacuum conditions, TIG welding, and the like. Preferably, the bonding of the peripheral boundary 105 of the target material 10 and backing plate material 15 is performed via E-beam welding under vacuum conditions.

After the peripheral bonding, the sputter target assembly 5 is consolidated, via pressure application thereto, at pressure of about 50 tons-5,000 tons; preferably less than about 1,000 tons, under low temperature conditions preferably of about room temperature to about 38° C. The protruding portions 40 are friction fit, preferably interference friction fit, into the corresponding grooves 30 through openings 60. The locking joint of the invention can therefore be described as a friction fit bond, preferably interference friction fit bond, formed between the sides 85, 90 of the protruding portions 40 and the corresponding upper portions 65, 70 of the grooves 30 sidewalls 45, 50. The artisan further will appreciate that the peripheral bonding can occur after pressure consolidation. Subsequent to consolidation, the mating surfaces 25, 30 are in direct contact with one another and the protruding portions 40 are received within grooves 30.

After the low temperature pressure consolidation, the sputter target assembly 5 may be subjected to a low temperature annealing step conducted at temperatures of about room to 400° C. for a period of 0.5 to 4 hours. This will help ensure adequate adhesion of the pressure consolidated surfaces.

The phrase "low temperature pressure consolidation" refers to pressure consolidation that may occur at temperatures of less than about 50% of the melting temperature of the lower melting point of either the target material 10 or backing plate material 15. Preferably, this temperature is less than about 200° C; most preferably at about room temperature up to about 38° C.

In the preferred embodiment, the lower portions 75, 80 and bottom portion 55 of the grooves 30 cooperate with the end portion 95 of the protruding portions 40 to define the cooling channels 20. As can be seen in FIG. 6, the distance from the mating surface 25 to the bottom portion 55 of the grooves 30, the "groove depth," is greater than the distance from the mating surface 35 to the end portion 95 of the protruding portions 40, the "protruding portion length." The cross section of the cooling channels 20 can be increase, or decreased, by varying the groove width or by varying the differential in the groove depth with respect to the protruding portion length.

With reference to FIGS. 1–4, the preferred backing plate material 15 further includes a coolant inlet 110 and a coolant outlet 115. The inlet 110 extends from the bottom side 120 of the backing plate material 15 to an inlet slot 125. The inlet slot 125 defines a passageway extending from the inlet 110 to the cooling channels 20. The outlet 115 extends from the bottom side 120 of the backing plate material 15 to an outlet slot 130. The outlet slot 130 defines a passageway extending from the cooling channels 20 to the outlet 115.

Forming the grooves 30 in the target material 10 and the protruding portions 40 in the backing plate is within the scope of the present invention. In either case, in the preferred embodiment, the grooves 30 and protruding portions 40 cooperate to form the channels 20 and to provide for an interference friction fit between the target material 10 and the backing plate material 15.

The cooperation of the grooves 30 with the protruding portions 40 in formation of the cooling channels 20, while also resulting in an interference friction fit bond between the target material 10 and the backing plate material 15, is a significant improvement. The resulting decrease in sputter target assembly 5 production time results in reduced cost.

Figure 7:
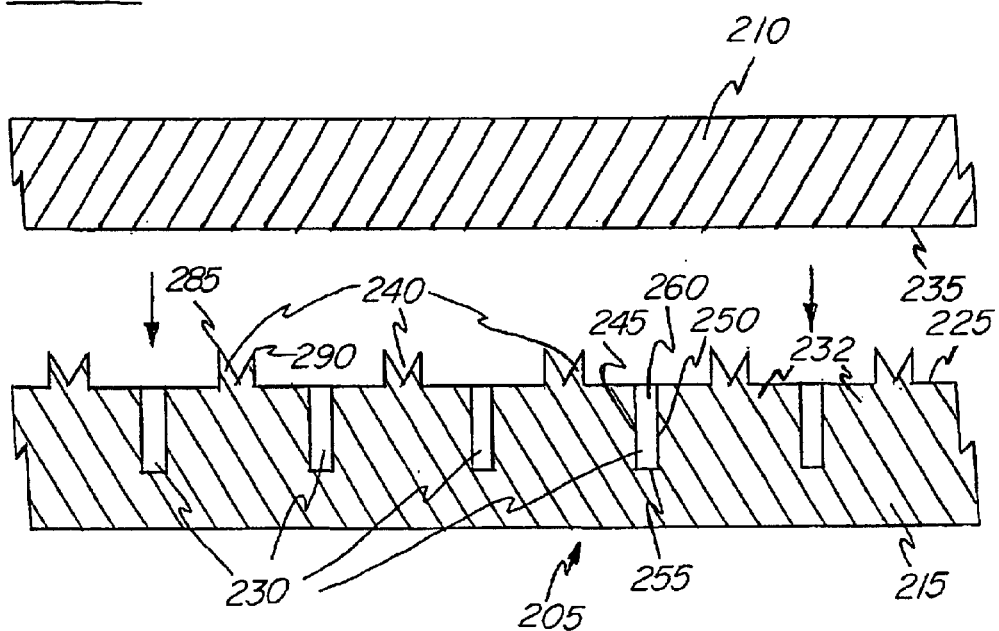
FIG. 7 depicts a profile view of a second embodiment of the sputter target assembly in accordance with the present invention prior to consolidation of the target material and backing plate material.
Figure 8:
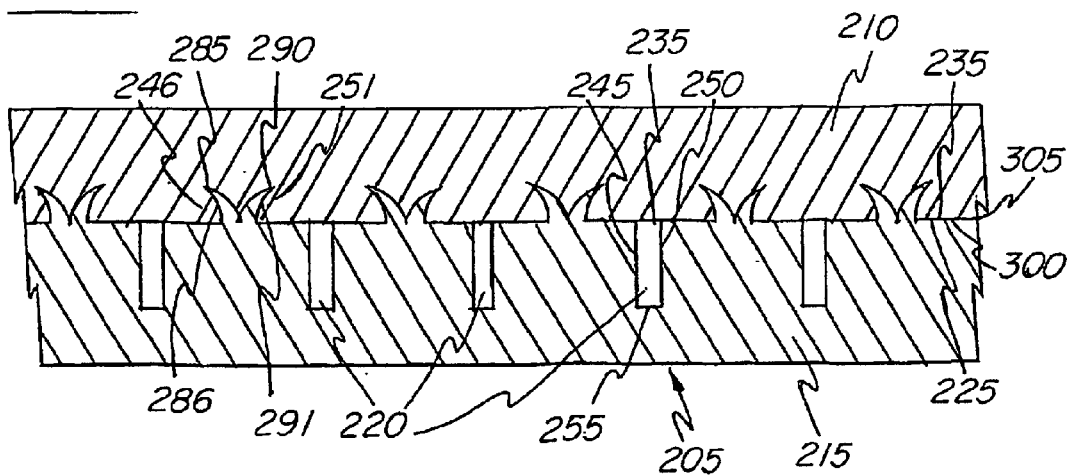
FIG. 8 depicts a profile view of the second embodiment of the sputter target assembly of FIG. 7 subsequent to consolidation of the target material and backing plate material.

A second embodiment of the present invention, depicted in FIGS. 7 and 8 as element 205, incorporates the protruding portions 240 formed in the backing plate material 215 along with the grooves 230. The grooves 230 comprise opposing sidewalls 245, 250, a bottom portion 255 and an opening 260. The grooves 230 define a plurality of islands 232 where the mating surface 225 remains. The protruding portions 240 extend from the mating surface 25 of the islands 232 and form a substantial "M" shape in cross section. As described in detail below, in this second embodiment, the bond between the target material 210 and the backing plate material 215 results independent of the formation of the cooling channels 220; the grooves 230 and the protruding portions 240 do not mate with one another. The consolidation method associated with this second embodiment results in cooling channels which can be made deeper than with use of the preferred embodiment for the same thickness of target material 210 or backing plate material 215; this is due to the fact that the protruding portions 240 do not occupy space in the grooves 230.

The sputter target assembly 205 is first bonded around an annular zone 300 adjacent the periphery 305 of the target assembly 205. The initial bonding, along the peripheral border 305 of the assembly 205, may be achieved, as described with regard to the preferred embodiment, by conventional means.

Turning now to FIG. 8, there is shown a sputter target assembly 205, in accordance with the second embodiment of the present invention, subsequent to the target material 210 and backing plate material 215 being consolidated. The low temperature pressure consolidation method as discussed above with regard to the preferred embodiment is preferred. As a result of the low temperature pressure consolidation the protruding portions 240 penetrate into the target material 210 and disrupt the oxide film that may exist along the mating surface 235, thereby, promoting a metal to metal cold diffusion type bond. The tips 285, 290 deform and fold back toward the mating surfaces 225, 235, providing a physical locking mechanism, or "ZIP bond," between the target material 210 and backing plate material 215.

With further reference to FIG. 8, the deformed edges 286, 291 of the "M" shaped protruding portions 240 are bent toward the mating surfaces 225, 235 as a result of the low temperature pressure consolidation. Each edge 286, 291 forms a re-entrant angle of about 55–60° relative to the mating surfaces 225, 235. Due to bending of the edges 286, 291, the tips 285, 290 of the protruding portions 240 adjacent edges 286, 291. The ZIP bond traps target material 246, 251 against separation forces, or vectors, that would act in shear or in a perpendicular direction relative to the mating surfaces 225, 235. Thereby, a tenacious bond is formed between the target material 210 and backing plate material 215. The assembly method of this second embodiment has shown promise in bonding high-purity target materials, such as Al, Al—Cu, or Al—Cu—Si, to lower-purity backing plate materials, such as Al 6061. The method may also be employed to bond Cu targets and Cu containing alloy targets over 6061 Al (or other Al alloys) or Cu metallurgies (Cu Alloys). The protruding portion length is varied to increase, or decrease, the bond strength.

Additionally, other target materials including Ta, W, and Ti and their alloys may be bonded to backing plates in accordance with the invention.

In this second embodiment, a portion of the mating surface 235 cooperates with the sidewalls 245, 250 and the bottom portion 255 of the grooves 230 to form the cooling channels 220; the openings 260 are thereby sealed. As can be seen in FIG. 8, the protruding portions 240 are not received in the grooves 230, therefore, the resulting cross section of the cooling channels 220 is only dependent upon the size of the grooves 230.

Turning now to FIGS. 9 and 10, there is shown a third embodiment of the present invention. As best seen in FIG. 9, the sputter target assembly 405 incorporates target material 410 and backing plate material 415. As with the second embodiment described above, the bond between the target material 410 and the backing plate material 415 results independent of the formation of the cooling channels 420. Unlike either of the preceding embodiments, this third embodiment incorporates receptacles 496, formed in the target material 410, for receiving the protruding portions 440. Each receptacle 496 has opposing sidewalls 497, 499 and an opening 498.

With further reference to FIG. 9, the protruding portions 440 extending from mating surface 425, along with grooves 430, are formed in the backing plate material 415. Each of the protruding portions 440 has opposing sides 485, 490 and an end portion 495. Each of the grooves 430 has opposing sidewalls 445, 450, a bottom portion 455 and an opening 460. The grooves 430 define a plurality of islands 432 where the mating surface 425 remains.

Subsequent to forming the receptacles 496, the grooves 430 and the protruding portions 440, the mating surface 435 is positioned proximate the mating surface 425 with the protruding portions 440 aligned with the receptacles 496. The assembly 405 is initially bonded around the periphery 505 of the annular zone 500. This initial bonding is preferably performed as was described with regard to the preceding embodiments.

The assembly 405 is then subjected to low temperature pressure consolidation as with the preceding embodiments. In this third embodiment, the protruding portions 440 are received within receptacles 496 through openings 498. The sides 485, 490 of the protruding portions 440 cooperate with the sidewalls 497, 499 of the receptacles 496, respectively, to result in a friction fit bond between the target material 410 and the backing plate material 415.

With further reference to FIG. 10, it can be seen that a portion of the mating surface 425 cooperates with the sidewalls 445, 450 and bottom portion 455 of the grooves 430 to form the cooling channels 420. The opening 460 is thereby sealed.

The low temperature annealing step, as described above in regard to the preferred embodiment, will induce improved bonding. As with the preferred embodiment, it is preferable to employ a protruding portion thickness greater than the groove width, thereby, providing for an interference friction fit between the target material 410 and the backing plate material 415.

In addition to providing the ability to maximize the cooling channel depth for a given target material 410 or backing plate material 415, as in regard to the second embodiment, this third embodiment further provides the ability to maximize the protruding portion length. Thereby, the surface area associated with the friction fit bond is maximized.

Figure 11:
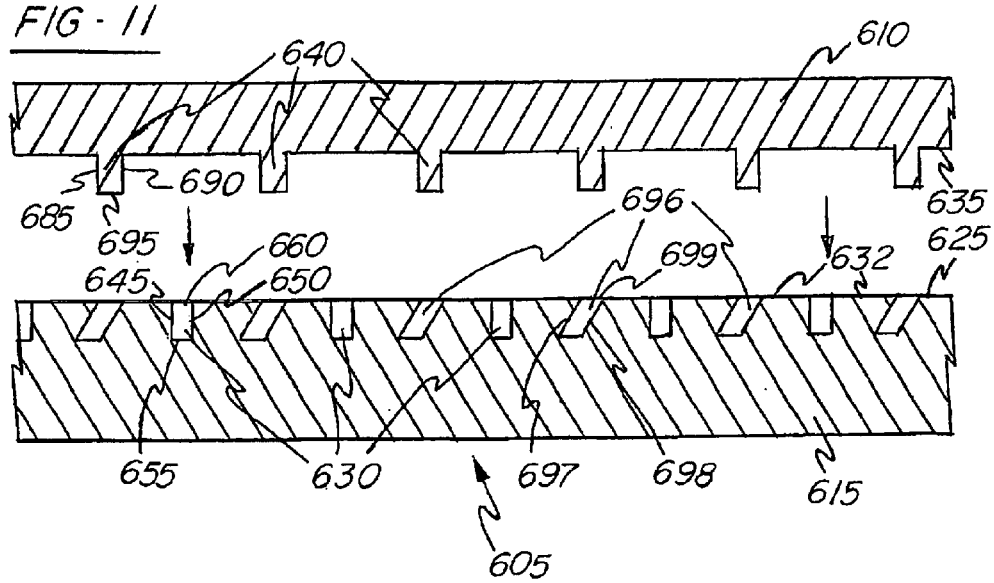
FIG. 11 depicts a profile view of a fourth embodiment of the sputter target assembly in accordance with the present invention prior to consolidation of the target material and backing plate material.
Figure 12:
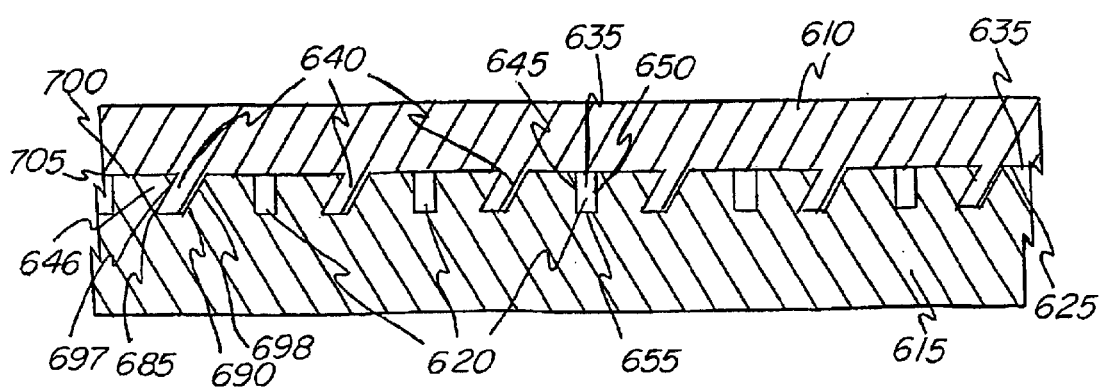
FIG. 12 depicts a profile view of the fourth embodiment of the sputter target assembly of FIG. 11 subsequent to consolidation of the target material and backing plate material.

Turning now to FIGS. 11 and 12, there is shown a fourth embodiment of the present invention. As best seen in FIG. 11, the sputter target assembly 605 incorporates target material 610 and backing plate material 615. As with the second and third embodiments described above, the bond between the target material 610 and the backing plate material 615 results independent of the formation of the cooling channels 620. This fourth embodiment incorporates receptacles 696 along with grooves 630, formed in the backing plate material 615. Each of the grooves 630 has opposing sidewalls 645, 650, a bottom portion 655 and an opening 660. The grooves 630 define a plurality of islands 632 where the mating surface 625 remains. Similar to the third embodiment, the receptacles 696 are for receiving the protruding portions 640. Each receptacle 696 has opposing sidewalls 697, 699 and an opening 698. Unlike the third embodiment, the receptacles 696 are sloped in relation to the mating surface 625, as apposed to being perpendicular to surface 625.

With further reference to FIG. 11, the protruding portions 640 extending from mating surface 635 are formed in the target material 610. Each of the protruding portions 640 has opposing sides 685, 690 and an end portion 695.

Subsequent to forming the receptacles 696, the grooves 630 and the protruding portions 640, the mating surface 635 is positioned proximate the mating surface 625 with the protruding portions 640 aligned with the receptacles 696. The assembly 605 is initially bonded around the periphery 705 of the annular zone 700. This initial bonding is preferably performed as was described with regard to the preceding embodiments.

The assembly 605 is then subjected to low temperature pressure consolidation as with the preceding embodiments. In this fourth embodiment, the protruding portions 640 are received within receptacles 696 through openings 698. The sides 685, 690 of the protruding portions 640 cooperate with the sidewalls 697, 699 of the receptacles 696, respectively, to result in a friction fit bond between the target material 610 and the backing plate material 615. Additionally, the protruding portions 640, when received in receptacles 696, trap the target material 646 against separation forces, or vectors, that would act in shear or in a perpendicular direction relative to the mating surfaces 625, 635. Thereby, a tenacious bond is formed between the target material 610 and the backing plate material 615 combining the strengths of the interference friction fit bond and the ZIP bond from the second and third embodiments.

With further reference to FIG. 12, it can be seen that a portion of the mating surface 625 cooperates with the sidewalls 645, 650 and bottom portion 655 of the grooves 630 to form the cooling channels 620. The openings 660 are thereby sealed.

The low temperature annealing step, as described above in regard to the preferred embodiment, will induce improved bonding. As with the preferred embodiment, it is preferable to employ a protruding portion thickness greater than the groove width, thereby, providing for an interference friction fit between the target material 610 and the backing plate material 615.

In addition to providing the ability to maximize the cooling channel 620 depth for a given target material 610 or backing plate material 615, as in regard to the second embodiment, and providing the ability to maximize the protruding portion length as in the third embodiment, this fourth embodiment further provides the ZIP bond feature of the second embodiment.

Turning now to FIGS. 13 and 14, there is shown a fifth embodiment of the present invention. As best seen in FIG. 13, the sputter target assembly 805 incorporates target material 810 and backing plate material 815. As with the second, third and fourth embodiments described above, the bond between the target material 810 and the backing plate material 815 results independent of the formation of the cooling channels 820. This fifth embodiment incorporates receptacles 896 along with grooves 830, formed in the backing plate material 815. Each of the grooves 830 has opposing sidewalls 845, 850, a bottom portion 855 and an opening 860. The grooves 830 define a plurality of islands 832 where the mating surface 825 remains. Similar to the third and fourth embodiments, the receptacles 896 are for receiving the protruding portions 840. Each receptacle 896 has opposing sidewalls 897, 899 and an opening 898. Similar to the fourth embodiment, the receptacles 896 are sloped in relation to the mating surface 825, as apposed to being perpendicular to surface 825. Unlike the fourth embodiment, the receptacles 896 are provided in pairs, with each individual receptacle 896 of a given pair of receptacles 896 slopes in an opposite direction originating from mating surface 825.

With further reference to FIG. 13, the protruding portions 840 extending from mating surface 835 are formed in the target material 810. Each of the protruding portions 840 has opposing sides 885, 890 and an end portion 895.

Subsequent to forming the receptacles 896, the grooves 830 and the protruding portions 840, the mating surface 835 is positioned proximate the mating surface 825 with the protruding portions 840 aligned with the receptacles 896. The assembly 805 is initially bonded around the periphery 905 of the annular zone 900. This initial bonding is preferably performed as was described with regard to the preceding embodiments.

The assembly 805 is then subjected to low temperature pressure consolidation as with the preceding embodiments. In this fifth embodiment, the protruding portions 840 are received within receptacles 896 through openings 898. The sides 885, 890 of the protruding portions 840 cooperate with the sidewalls 897, 899 of the receptacles 896, respectively, to result in a friction fit bond, preferably an interference friction fit bond, between the target material 810 and the backing plate material 815. Additionally, the protruding portions 840, when received in receptacles 896, trap the target material 846 against separation forces, or vectors, that would act in shear or in a perpendicular direction relative to the mating surfaces 825, 835. Thereby, a tenacious bond is formed between the target material 810 and the backing plate material 815 combining the strengths of the interference friction fit bond and the ZIP bond similar to the fourth embodiment only with double the number of protruding portions 840 and receptacles 896.

With further reference to FIG. 14, it can be seen that a portion of the mating surface 825 cooperates with the sidewalls 845, 850 and bottom portion 855 of the grooves 830 to form the cooling channels 820. The openings 860 are thereby sealed.

The low temperature annealing step, as described above in regard to the preferred embodiment, will induce improved bonding. As with the preferred embodiment, it is preferable to employ a protruding portion thickness greater than the groove width, thereby, providing for an interference friction fit between the target material 810 and the backing plate material 815.

In addition to providing the ability to maximize the cooling channel 820 depth for a given target material 810 or backing plate material 815, as in regard to the second embodiment, and providing the ability to maximize the protruding portion length as in the third embodiment, and providing the ZIP bond feature of the fourth embodiment, this fifth embodiment provides two protruding portions 840 and receptacles 896 corresponding to each island 832.

Turning to FIGS. 15 and 16, there is shown a sixth embodiment of a sputter target assembly 1005 in accordance with the present invention. As best seen with reference to FIG. 15, the preferred sputter target assembly 1005 comprises a target material 1010 bonded to a backing plate material 1015 such that cooling channels 1020 are integrally formed therewithin similar to the preferred embodiment. Initially, both the target material 1010 and the backing plate material 1015 are formed into individual discs. In this sixth embodiment, similar to the preferred embodiment, the grooves 1030 are then formed in the substantially circular mating surface 1025 of the backing plate material 1015. The grooves 1030 define a plurality of islands 1032 where the mating surface 1025 remains. Unlike the preferred embodiment, the grooves 1030 are formed at a slope in reference to the mating surface 1025, as apposed to being perpendicular to surface 1025. Protruding portions 1040, defining a mirror image of the grooves 1030 of mating surface 1025, are formed in the substantially circular mating surface 1035 of the target material 1010. As discussed in detail below, the grooves 1030 and the protruding portions 1040 cooperate to result in a friction fit bond, preferably an interference friction fit bond, between the target material 1010 and the backing plate material 1015, as well as, forming the cooling channels 1020.

With specific reference to FIG. 15, the grooves 1030 are shown to include opposing sidewalls 1045, 1050, a bottom portion 1055 and an opening 1060. Each sidewall 1045, 1050 comprises an upper portion 1065, 1070, respectively, and a lower portion 1075, 1080, respectively. The protruding portions 1040 include opposing sides 1085, 1090 and an end portion 1095. Referring to FIG. 16, the protruding portions 1040 are shown as having been received within the grooves 1030 through openings 1060. The upper portions 1065, 1070 of the grooves 1030 cooperate with the sides 1085, 1090 of the protruding portions 1040 to form a friction fit bond, preferably an interference friction fit bond, between the target material 1010 and the backing plate material 1015.

Subsequent to forming the grooves 1030 and protruding portions 1040, the mating surface 1025 is positioned proximate mating surface 1035, with protruding portions 1040 aligned with corresponding grooves 1030, the sputter target assembly 1005 is then bonded along an annular zone 1100 adjacent the peripheral boundary 1105. This initial bonding along the annular zone 1100 of the assembly 1005 may be achieved by conventional means as in the previous embodiments.

After the peripheral bonding, the sputter target assembly 1005 is consolidated, via pressure application thereto, preferably as with the previous embodiments. The protruding portions 1040 are friction fit, preferably interference friction fit, into the corresponding grooves 1030 through openings 1060. The locking joint of the invention can therefore be described as a friction fit bond, preferably interference friction fit bond, formed between the sides 1085, 1090 of the protruding portions 1040 and the corresponding upper portions 1065, 1070 of the grooves 1030 sidewalls 1045, 1050. Subsequent to consolidation, the mating surfaces 1025, 1030 are in direct contact with one another and the protruding portions 1040 are received within grooves 1030.

After the low temperature pressure consolidation, the sputter target assembly 1005 may be subjected to a low temperature annealing as with the previous embodiments. This will help ensure adequate adhesion of the pressure consolidated surfaces.

In this sixth embodiment, the lower portions 1075, 1080 and bottom portion 1055 of the grooves 1030 cooperate with the end portion 1095 of the protruding portions 1040 to define the cooling channels 1020. As can be seen in FIG. 16, the distance from the mating surface 1025 to the bottom portion 1055 of the grooves 1030, the "groove depth," is greater than the distance from the mating surface 1035 to the end portion 1095 of the protruding portions 1040, the "protruding portion length." The cross section of the cooling channels 1020 can be increase, or decreased, by varying the groove width or by varying the differential in the groove depth with respect to the protruding portion length.

As with the preferred embodiment, the cooperation of the grooves 1030 with the protruding portions 1040 in formation of the cooling channels 1020, while also resulting in an interference friction fit bond between the target material 1010 and the backing plate material 1015, is a significant improvement. The resulting decrease in sputter target assembly 1005 production time results in reduced cost. In addition, the protruding portions 1040, when received in receptacles 1096, trap the target material 1046 against separation forces, or vectors, that would act in shear or in a perpendicular direction relative to the mating surfaces 1025, 1035.

Thereby, a tenacious bond is formed between the target material 1010 and the backing plate material 1015 combining the strengths of the interference friction fit bond and the ZIP bond similar to the fourth embodiment.

Turning now to FIGS. 17 and 18, there is shown a seventh embodiment of the sputter target assembly 1205 in accordance with the present invention. As best appreciated with reference to FIG. 17, the assembly 1205 comprises a target material 1210 and a backing plate material 1215 with an interposing material 1211 therebetween. This seventh embodiment is most preferred when the thermal expansion coefficients of the target material 1210 and the backing plate material 1215 are such that direct bonding is impractical. The interposing material 1211 is chosen with a thermal expansion coefficient between that of the target material 1210 and that of the backing plate material 1215.

Although the seventh embodiment is shown to have a ZIP bond, similar to the second embodiment, between the target material 1210 and the interposing material 1211, the bonds as depicted in any of the previous embodiments may be employed; this is similarly true for the bond between the interposing material 1211 and the backing plate material 1215. Additionally, formation of the cooling channels 1420 can, in accordance with the present invention, result in the channels 1420 being in the target material 1210, the interposing material 1211 or the backing plate material 1215; a second interposing material may also be incorporated into the sputter target assembly, this may, within the scope of the present invention, result in the cooling channels 1420 being formed within an interposing material independent of the remaining components of the sputter target assembly 1205.

With further reference to FIG. 17, the protruding portions 1240 are formed as extending from the mating surface 1225 of the interposing material 1211. The grooves 1430 are formed in the mating surface 1435 of the interposing material 1211. The grooves 1430 comprise opposing sidewalls 1445, 1450, a bottom portion 1455 and an opening 1460. Each sidewall 1445, 1450 comprises an upper portion 1465, 1470, respectively, and a lower portions 1475, 1480, respectively. The protruding portions 1240 form a substantial "M" shape in cross section and include tips 1285, 1290.

A second set of protruding portions 1440 are formed as extending from the backing plate material 1215 mating surface 1425 and defining islands 1432 therebetween. Each protruding portion 1440 includes opposing sides 1485, 1490 and an end portion 1495.

Subsequent to formation of the protruding portions 1240, the grooves 1430 and the second set of protruding portions 1440, the mating surface 1235 is positioned proximate the mating surface 1225; the mating surface 1435 is positioned proximate the mating surface 1425 such that the protruding portions 1440 align with the grooves 1430.

The sputter target assembly 1205 is then bonded along the annular zones 1300, 1500 adjacent the peripheral boundaries 1305, 1505. This initial bonding is preferably performed as with the preceding embodiments. This bonding, like all the previous embodiments, may be performed subsequent to the low temperature pressure consolidation described below.

After the peripheral bonding, the sputter target assembly 1205 is subjected to the low temperature pressure consolidation as described with regard to the preceding embodiments. The protruding portions 1240 penetrate into the target material 1210 and disrupt the oxide film that may exist along the mating surface 1235, thereby, promoting a metal to metal cold diffusion type bond. The tips 1285, 1290 deform and fold back toward the mating surfaces 1225, 1235, providing a physical locking mechanism, or ZIP bond, between the target material 1210 and the interposing material 1211.

With further reference to FIG. 18, the deformed edges 1286, 1291 of the "M" shaped protruding portions 240 are bent toward the mating surfaces 1225, 1235 as a result of the low temperature pressure consolidation. Each edge 1286, 1291 forms a re-entrant angle of about 55–60° relative to the mating surfaces 1225, 1235. Due to bending of the edges 1286, 1291, the tips 1285, 1290 of the protruding portions 1240 adjacent edges 1286, 1291. The ZIP bond traps target material 1246, 1251 against separation forces, or vectors, that would act in shear or in a perpendicular direction relative to the mating surfaces 1225, 1235. Thereby, a tenacious bond is formed between the target material 1210 and the interposing material 1211.

With further reference to FIG. 18, the upper portions 1465, 1470 of the grooves 1430 cooperate with the sides 1485, 1490 of the protruding portions 1440 to form a friction fit bond, preferably an interference friction fit bond, between the interposing material 1211 and the backing plate material 1215. The lower portions 1475, 1480 and the bottom portion 1455 of the grooves 1430 cooperate with the end portion 1495 of the protruding portions 1440 to define the cooling channels 1420.

Having described the above embodiments of the present invention, the artisan will appreciate that many combinations of the individual bonding methods are within the scope of the present invention. High strength bonds, required in high rate sputtering processes utilizing sputter target assemblies comprising dissimilar target material and backing plate material, are provided by the present invention. The bonding methods of the present invention are most preferred with sputter target assemblies incorporating internal cooling channels; the low temperature pressure consolidation does not induce deformation of the cooling channels nor cause undesirable grain growth in the target material.

What is claimed is:

1. A method of manufacturing a sputter target assembly including a target material with mating surface and a backing plate material with mating surface, comprising:
   a) forming a plurality of grooves in at least one of said materials and a plurality of protruding portions projecting from at least one of said mating surfaces;
   b) positioning said target material and said backing plate material adjacent each other to form a sputter target assembly having an interface defined by said mating surfaces; and
   c) pressure consolidating said assembly under low temperature conditions such that said target material is bonded to said backing plate material forming cooling channels therewithin.

2. A method of manufacturing a sputter target assembly as in claim 1, wherein said grooves are formed in said backing plate material mating surface and said protruding portions are formed in said target material mating surface.

3. A method of manufacturing a sputter target assembly as in claim 1, wherein said protruding portions are received within said grooves cooperating to form said cooling channels.

4. A method of manufacturing a sputter target assembly as in claim 3, wherein a friction fit bond is produced between said protruding portions and said grooves.

5. A method of manufacturing a sputter target assembly as in claim 2, wherein said protruding portions are received within said grooves cooperating to form said cooling channels.

6. A method of manufacturing a sputter target assembly as in claim 5, wherein a friction fit bond is produced between said protruding portions and said grooves.

7. A method of manufacturing a sputter target assembly as in claim 1, wherein said protruding portions are "M" shaped in cross section.

8. A method of manufacturing a sputter target assembly as in claim 7, wherein said protruding portions are formed in said backing plate material mating surface.

9. A method of manufacturing a sputter target assembly as in claim 8, wherein said protruding portions penetrate said target material mating surface producing a ZIP bond between said target material and said backing plate material.

10. A method of manufacturing a sputter target assembly as in claim 1, wherein the protruding portion thickness is greater than the groove width and said protruding portions are received within said grooves producing an interference friction fit bond between said target material and said backing plate material.

11. A method of manufacturing a sputter target assembly as in claim 1, wherein step b) further comprises; forming a plurality of receptacles in at least one of said mating surfaces.

12. A method of manufacturing a sputter target assembly as in claim 10, wherein said protruding portions are received with said receptacles producing a friction fit bond between the target material and the backing plate material.

13. A method of manufacturing a sputter target assembly as in claim 1, wherein said grooves cooperate with one of said mating surfaces to form cooling channels.

14. A method of manufacturing a sputter target assembly including a target material with mating surface, an interposing material with mating surfaces and a backing plate material with mating surface, comprising:

a) forming a plurality of grooves in at least one of said materials and a plurality of protruding portions projecting from at least two of said mating surfaces;

b) positioning said target material mating surface adjacent on of said mating surfaces of said interposing material and positioning said backing plate material mating surface adjacent said other of said mating surfaces of said interposing material to form a sputter target assembly having interfaces defined by said mating surfaces; and c) pressure consolidating said assembly under low temperature conditions such that said target material and said backing plate material is bonded to said interposing material forming cooling channels therewithin.

15. A method of manufacturing a sputter target assembly as in claim 13, wherein said grooves are formed in said one of said mating surfaces of said interposing material and said protruding portions are formed in the other of said mating surfaces of said interposing material.

16. A method of manufacturing a sputter target assembly as in claim 14, wherein protruding portions are formed in said backing plate material and are received with said grooves producing a friction fit bond between the backing plate material and the interposing material.

17. A method of manufacturing a sputter target assembly as in claim 15, wherein said protruding portions formed in said mating surface of said interposing material penetrate into said target material mating surface producing a ZIP bond between said target material and said interposing material.

18. A method of manufacturing a sputter target assembly as in claim 15, wherein cooling channels are formed by cooperation of said protruding portions with said grooves.

19. A method of manufacturing a sputter target assembly as in claim 13, wherein cooling channels are formed by cooperation of said grooves with one of said mating surfaces.

20. Method as recited in claim 1 wherein said target comprises a metal selected from the group consisting of Al, Cu, Ta, W, Ti, and their alloys.

\* \* \* \* \*